United States Patent
Song et al.

(10) Patent No.: US 8,279,018 B1
(45) Date of Patent: Oct. 2, 2012

(54) TRIFILA BALUN FOR WIRELESS TRANSCEIVER

(75) Inventors: Ping Song, Singapore (SG); Poh Boon Leong, Singapore (SG)

(73) Assignee: Marvell International Ltd., Hamilton (BM)

(*) Notice: Subject to any disclaimer, the term of this patent is extended or adjusted under 35 U.S.C. 154(b) by 290 days.

(21) Appl. No.: 12/724,836

(22) Filed: Mar. 16, 2010

Related U.S. Application Data

(60) Provisional application No. 61/160,514, filed on Mar. 16, 2009.

(51) Int. Cl.
  *H03H 7/42* (2006.01)
  *H03H 5/00* (2006.01)
(52) U.S. Cl. .......................................... 333/25; 333/132
(58) Field of Classification Search .................... 333/25, 333/26, 132
  See application file for complete search history.

(56) References Cited

U.S. PATENT DOCUMENTS

| | | | |
|---|---|---|---|
| 7,209,727 B2* | 4/2007 | Castaneda et al. ............ | 455/341 |
| 7,554,404 B2* | 6/2009 | Roufoogaran ................ | 330/261 |
| 7,683,851 B2* | 3/2010 | Rofougaran et al. ......... | 343/850 |

OTHER PUBLICATIONS

B. Marholev et al, "A Single-Chip Bluetooth EDR Device in 0.13 μm CMOS", 2007 IEEE International Solid-State Circuits Conference, Feb. 14, 2007.
B. Marholev et al, "A Single-Chip Bluetooth EDR Device in 0.13 μm CMOS" slide show presentation, 2007 IEEE International Solid-State Circuits Conference, Feb. 14, 2007.

* cited by examiner

*Primary Examiner* — Dean O Takaoka

(57) ABSTRACT

In one embodiment, an apparatus for transmitting and receiving wireless communications is provided. A balun is coupled to an antenna. The antenna transmits and receives radio frequency signals. The balun includes a first inductor including a first set of ports coupled to the antenna. The balun includes a second inductor with a second set of ports coupled to a power amplifier through a first circuit. The power amplifier transmits a first signal to the antenna. The balun also includes a third inductor with a third set of ports coupled to a low noise amplifier through a second circuit. The low noise amplifier receives a second signal from the antenna. The second set of ports is coupled to the first circuit and the third set of ports is coupled to the second circuit. Also, the first circuit is separate from the second circuit.

18 Claims, 5 Drawing Sheets

TRIFILA BALUN FOR WIRELESS TRANSCEIVER

CROSS REFERENCE TO RELATED APPLICATIONS

The present application claims priority to U.S. Provisional App. No. 61/160,514 for "Balun Design" filed Mar. 16, 2009, the contents of which is incorporated herein by reference in their entirety.

BACKGROUND

The present disclosure generally relates to communications systems and more particularly to wireless transceivers.

Unless otherwise indicated herein, the approaches described in this section are not prior art to the claims in this application and are not admitted to be prior art by inclusion in this section.

In wireless transceivers, a radio frequency (RF) front end includes a matching network that provides impedance matching between an antenna and either the transmitter or receiver. FIG. 1 depicts an example of a conventional transceiver 100. Transceiver 100 includes a matching network 102, a power amplifier (PA) 104, a low noise amplifier (LNA) 106, and an antenna 108. A transmitter includes PA 104 and a receiver includes LNA 106. A front end of transceiver 100 includes matching network 102.

Matching network 102 may be a balun or any matching network, such as an inductor capacitor (LC), T-matching or π-matching network, etc. Matching network 102 is inserted between an antenna 108 and PA 104/LNA 106.

Matching network 102 provides an impedance transformation such that a load of $Z_{load}$ is transformed to achieve the desired impedance for the impedance transformation with $Z_s$, the impedance of antenna 108. $Z_{load}$ is the impedance of either PA 104 or LNA 106 looking into matching network 102.

Different matching networks 102 may be used. FIG. 2 depicts an example of a conventional balun 202 being used as a matching network. Balun 202 transforms $Z_{load}$ to the desired impedance. For example, if the desired optimum loading for $Z_{load}$ for PA 1-104 is 100 ohm, while the antenna impedance, $Z_s$, is 50 ohm, then the impedance ratio of inductors 204a and 204b is $L_1:L_2=1:2$.

If the 1:2 ratio is desired for PA 1-104, a drawback of a shared front end for PA 104 and LNA 1-106 is that there is less flexibility in designing for the optimum LNA loading. For example, if PA 1-104 transmits with a larger output power, which requires a smaller loading resistance, $Z_{load}$, then the impedance ratio between $L_1$ and $L_2$ is small. This causes a small matching network gain for LNA 1-106 in a receive path. A small matching network gain may result in a poor noise figure in signals received. With a shared front end, the receive path performance will have to be compromised because LNA 1-106 shares balun 202 with PA 1-104. Thus, the design of balun 202 cannot be varied and the receive path uses an impedance ratio of 1:2 even though the ratio may not be optimal for the receiver.

Balun 202 may also be designed with an impedance ratio for optimum receiver performance by having $Z_{load}$ be higher. However, the transmitted output power may not be optimized because of the high impedance. Thus, having a matching network that is shared does not optimize both transmitter and receiver performance.

A balun may be designed with three inductors to allow slight variance in transmit and receive characteristics. FIG. 3 shows an example of a conventional three inductor balun 300.

Balun 300 includes three inductors 308a-308c. Balun 300 may tap inductors 308b and 308c at different points. In this way, the transmitter and receiver may be designed with different characteristics. For example, PA 1-104 taps balun 300 at points 302a and 302b. Also, LNA 1-106 taps balun 300 at points 304a and 304b. There are two inductors—$L_1$ and $L_2$. $L_1$ and $L_2$ couple from antenna 1-108 to LNA 1-106 and achieve the designated impedance transformation. $L_3$ and $L_1$ couple from PA 1-104 to antenna 1-108 and achieve the designated impedance transformation. This architecture may achieve the independent impedance transformation in the receiver and antenna, and transmitter and antenna by varying the tapping point of $L_3$ from $L_2$. However, there are multiple drawbacks. For example, there is poor isolation between the receiver and transmitter. Also, it may be less flexible to tap out at ports 302a and 302b due to the limitation of the inductor geometry. Also, any trace tapping out from ports 302a and 302b will form extra parasitic inductance on the lines from PA 1-104 and LNA 1-106 to inductor $L_2$.

SUMMARY

In one embodiment, an apparatus for transmitting and receiving wireless communications is provided. A balun is coupled to an antenna. The antenna transmits and receives radio frequency signals. The balun includes a first inductor including a first set of ports coupled to the antenna. The balun includes a second inductor with a second set of ports coupled to a power amplifier through a first circuit. The power amplifier transmits a first signal to the antenna. The balun also includes a third inductor with a third set of ports coupled to a low noise amplifier through a second circuit. The low noise amplifier receives a second signal from the antenna. The second set of ports is coupled to the first circuit and the third set of ports is coupled to the second circuit. Also, the first circuit is separate from the second circuit.

In one embodiment, an apparatus is provided comprising: a balun coupled to an antenna, the antenna configured to transmit and receive radio frequency signals, the balun comprising: a first inductor including a first set of ports coupled to the antenna; a second inductor including a second set of ports coupled to a power amplifier through a first circuit, the power amplifier configured to transmit a first signal to the antenna; a third inductor including a third set of ports coupled to a low noise amplifier through a second circuit, the low noise amplifier configured to receive a second signal from the antenna, wherein the second set of ports is coupled to the first circuit, wherein the third set of ports is coupled to the second circuit, wherein the first circuit is separate from the second circuit.

In another embodiment, a method is provided comprising: transmitting a first signal to an antenna coupled to a first inductor through a first set of ports, the first signal being transmitted from a first circuit coupled to a second inductor through a second set of ports; receiving a second signal from the antenna through the first inductor, the second signal received from the antenna through a third inductor coupled to a second circuit through a third set of ports, wherein the second set of ports is coupled to the first circuit, wherein the third set of ports is coupled to the second circuit, wherein the first circuit is separate from the second circuit.

The following detailed description and accompanying drawings provide a better understanding of the nature and advantages of the present invention.

DETAILED DESCRIPTION

Described herein are techniques for a trifila balun design. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 4:
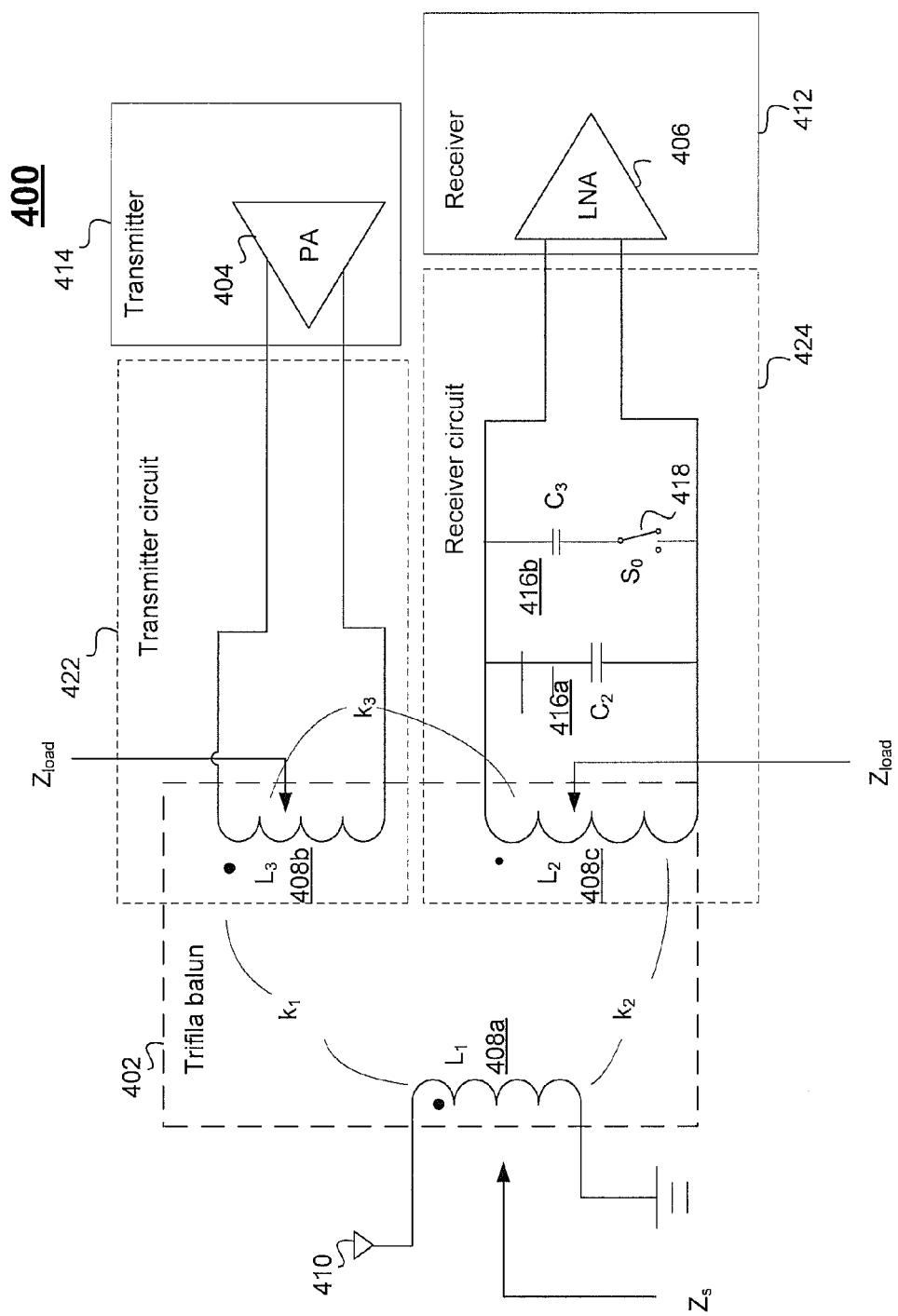
FIG. 4 depicts an example of a transceiver according to one embodiment.

FIG. 4 depicts an example of a transceiver 400 according to one embodiment. Transceiver 400 may be included in a wireless communication device. Transceiver 400 is configured to transmit and receive radio frequency signals through an antenna 410.

A receiver 412 receives the RF signals and uses a low noise amplifier (LNA) 406 to amplify the received signal. A mixer (not shown) translates the carrier frequency of the modulated signal, down-converting the frequency of the modulated signal in the receiver. The down-converted, baseband signal may be filtered and converted from an analog signal to a digital representation by an analog-to-digital converter (ADC) (not shown). The digital representation may be transferred to a baseband processor (not shown). A person of skill in the art will appreciate the processing of the RF signal based on the teachings and disclosure herein.

A transmitter 414 converts baseband signals into RF signals by mixing the baseband signals with an RF carrier to produce the RF signals. A person of skill in the art will appreciate the processing of the baseband signals into RF signals based on the teachings and disclosure herein. Transmitter 414 includes a power amplifier (PA) 404 for amplifying the RF signals.

A radio frequency (RF) front end is used to convert single-ended RF signals into differential RF signals for a receiver and to combine differential RF signals into single-ended signals for a transmitter. A matching network may be used to perform the conversion. Also, the RF front-end is used to provide individual impedance transformations between an antenna 410 and PA 404 or LNA 406. In one embodiment, a trifila balun 402 is used to provide the individual impedance transformation. Balun 402 provides an electrical separation of transmitter 414 and receiver 412 and a low coupling coefficient between transmitter 414 and receiver 412.

Balun 402 includes three inductors 408a ($L_1$), 408b ($L_3$), and 408c ($L_2$). Inductor 408a is coupled to antenna 410. Inductor 408b is coupled to PA 404 of transmitter 414. For example, a transmitter circuit 422 is used to couple PA 404 to ports of inductor 408b. Transmitter circuit 422 is in a transmit path that is used to transmit signals from PA 404 to antenna 410 through balun 402. Inductor 408c is coupled to LNA 406 of receiver 412. For example, a receiver circuit 424 is used to couple LNA 406 to ports of inductor 308c. Receiver circuit 424 is in a receive path that is used to receive signals from antenna 410 through balun 402 at LNA 406.

Separate circuits provide improved electrical separation between transmitter 414 and receiver 412. For example, transmitter circuit 422 has weak electrical coupling to receiver circuit 424 in the transmit path from PA 404 to inductor 408b. Also, receiver circuit 424 has weak electrical coupling to transmitter circuit 422 in the receive path from inductor 408c to LNA 406. Additionally, ports of inductors 408b and 408c have weak electrical coupling. This leaves ports of inductors 408b and 408c improves isolation between transmitter 414 and receiver 412. As will be described below, the performance of transmitter 414 and receiver 412 may be optimized individually because of the separation.

Balun 402 is also designed such that a coupling coefficient is high between an inductor 408a and 408b ($k_1$) and also between inductor 408a and an inductor 408c ($k_2$). However, the coupling coefficient is low between inductor 408b and inductor 408c ($k_3$). A coupling coefficient may measure a level of coupling between inductors for mutual inductance. Mutual inductance occurs when the change in current in one inductor induces a voltage in another nearby inductor. A higher coupling coefficient means a higher mutual inductance. The coupling coefficient is between 0 and 1, with 1 being high and 0 being low. Because the coupling between inductor 408b and inductor 408c is low, less interference between the transmitter 414 and receiver 412 results. The coupling in this case may be electromagnetic between inductors.

Balun 402 provides an individual impedance transformation between antenna 410 and LNA 406 or PA 404. For example, if antenna 410 includes an impedance of 50 ohm at an operating frequency, balun 402 can achieve a different impedance ratio for transmitter 414 and receiver 412. The impedance ratio may change depending on whether data is being transmitted or received.

Individual impedance transformations allow transmitter 414 and receiver 412 may be optimized independently. For example, receiver 412 can be designed to provide a high voltage gain with a low noise figure. Thus, for receiver 412, the impedance may be higher. Also, transmitter 414 can be designed with a low impedance, which provides higher power for transmitting.

Figure 1:
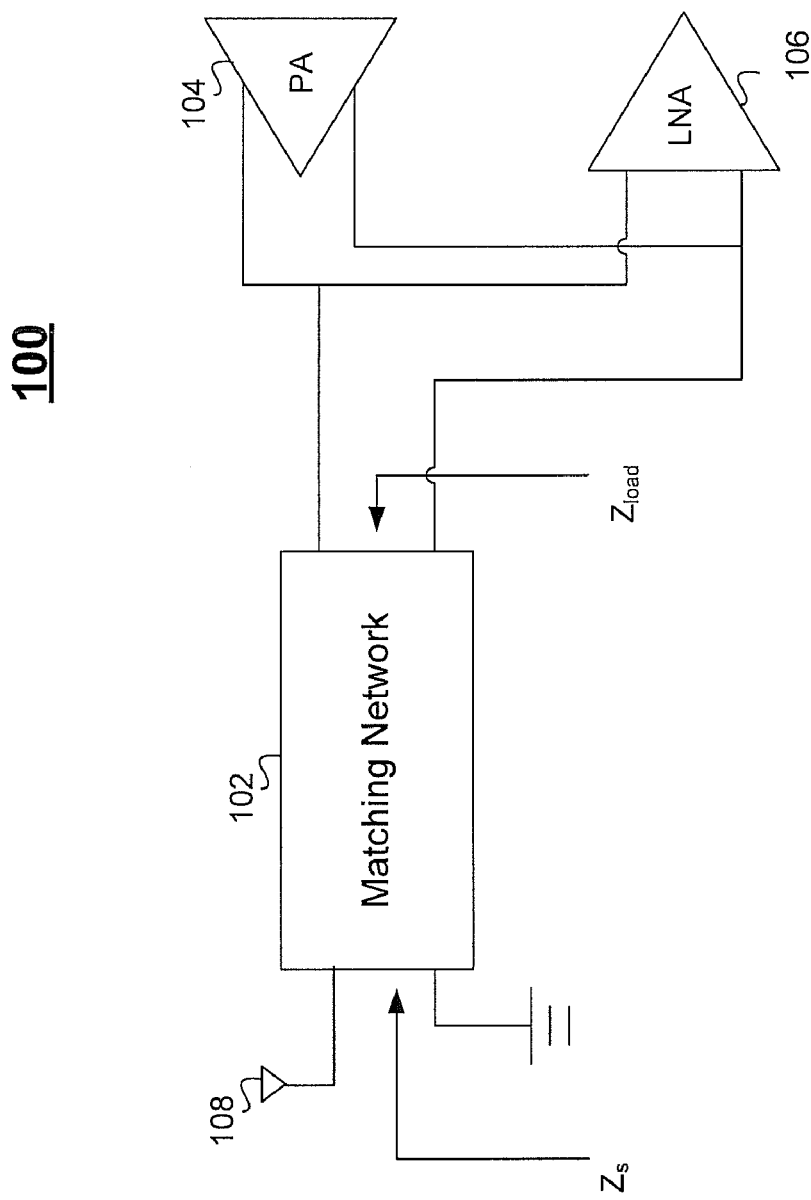
FIG. 1 depicts an example of a conventional transceiver.
Figure 2:
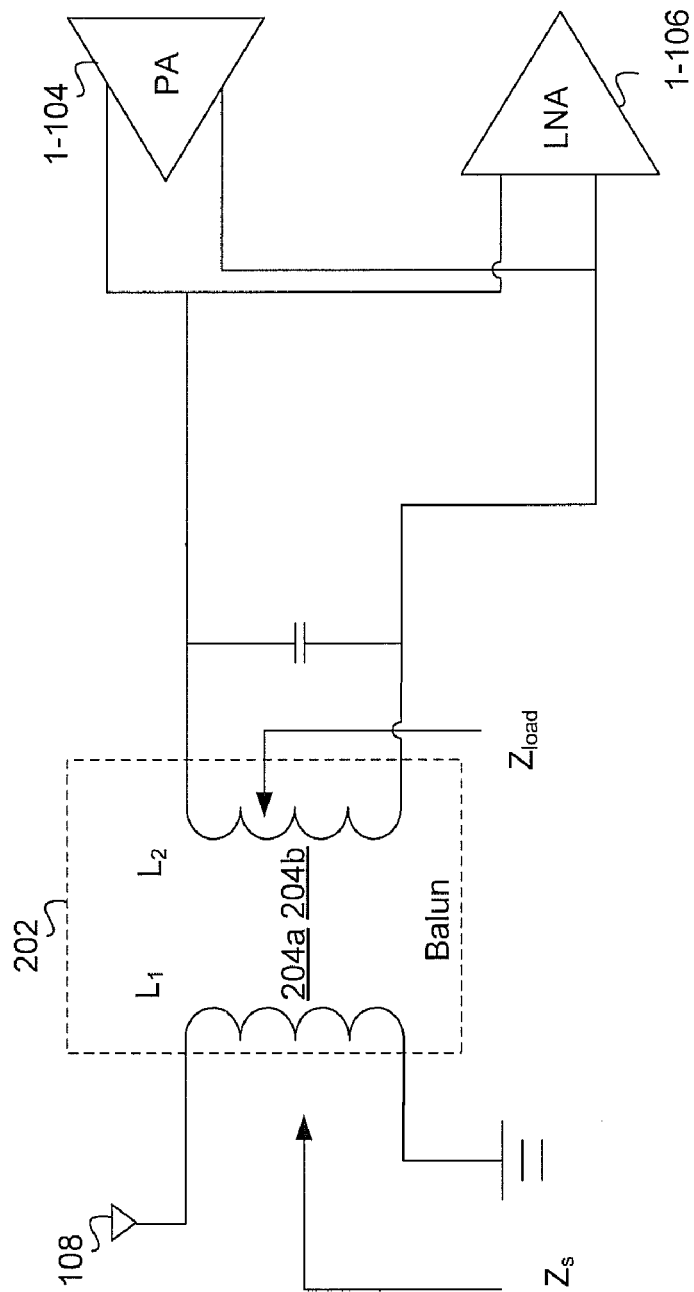
FIG. 2 depicts an example of a conventional balun being used as matching network.
Figure 3:
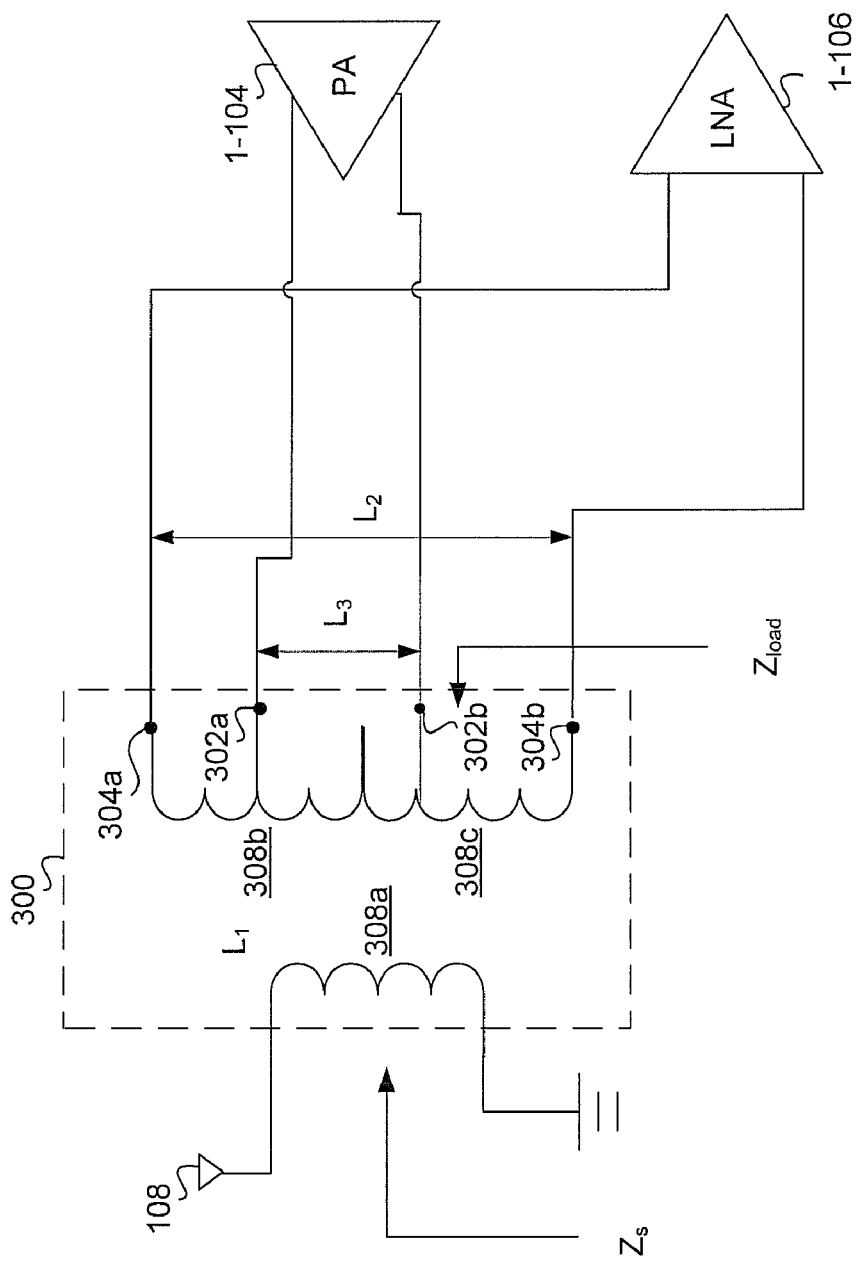
FIG. 3 shows another example of a conventional three inductor balun.

A turn ratio between inductor 408a and inductor 408b can also be designed separately from a turn ratio between inductor 408a and inductor 408c. The turn ratio may be a ratio of the number of turns between two inductors. Because circuit 422 is electrically separated from circuit 424, the number of turns in inductor 408b may be designed separately from the number of turns in inductor 408c. This is because circuit 422 is not electrically connected to circuit 424 and thus current does not run through an inductor 408c, and vice versa. This is in contrast to the conventional transceiver shown in FIG. 3 in which the transmitter and receiver both use turns of inductors 308b and 308c and the electrical isolation is poor.

In particular embodiments, inductor 408b may be designed separately in the transmitter path from inductor 408c, and inductor 408c may be designed separately from inductor 408b for the receiver path. Thus, if a first turn ratio is desired for the transmit path, inductor 408b can be designed with a number of turns to achieve the first turn ratio with inductor 408a. The number of turns of inductor 408c in the receive path do not need to be used or taken into account.

Transceiver 400 may operate in a half duplex or full duplex mode. Half duplex is where only one of receiver 412 or transmitter 414 is on. Full duplex is where both receiver 412 and transmitter 414 are on at the same time. When transceiver 400 operates in the half duplex mode, a switch-capacitor branch of capacitor 416b ($C_3$) and switch 418 ($S_O$) may be turned on. Capacitor 416b compensates for a different parasitic capacitance from LNA 406 in the turn-on mode and the turn-off mode. The parasitic capacitance of receiver 412 should be constant to maintain transmitter performance. When transmitting, receiver 412 is powered down and switch $S_O$ is turned on to turn on capacitor 416b. Capacitor 416b compensates for the difference in the change in capacitance when receiver 412 is turned off. For example, the capacitance changes to a lower value when receiver 412 goes from on to off. Capacitor 416b keeps the capacitance seen at receiver 412 the same when receiver 412 is turned off.

When front end 420 is in full duplex mode, switch 418 is not toggled and is open. Capacitor 418b may not be needed because receiver 412 is not being turned on and off and the capacitance is not changing. Also, as long as the resistance of switch 418 is small enough, the transistor of switch 418 will not be stressed.

Capacitor 416a is designed such that in full duplex mode (i.e., when the transmitter and receiver are both on at the same time), both circuits 422 and 424 resonate out automatically at the operating frequency. For example, the two transformation loops between inductors 408a and 408b and inductors 408a and 408c resonate at the desired operating frequency simultaneously. Also, in half duplex mode, either inductors 408a and 408b or inductors 408a and 408c resonate at the operating frequency.

As mentioned above, the coupling co-efficient is strong between inductor 408a and inductor 408b and between inductor 408a and inductor 408c, but low between inductor 408b and inductor 408c. The following describes a method of designing a layout of a chip to provide the desired couplings. Although this method is described, other methods and designed may be used. Particular embodiments are not limited to the described design.

Figure 5A:
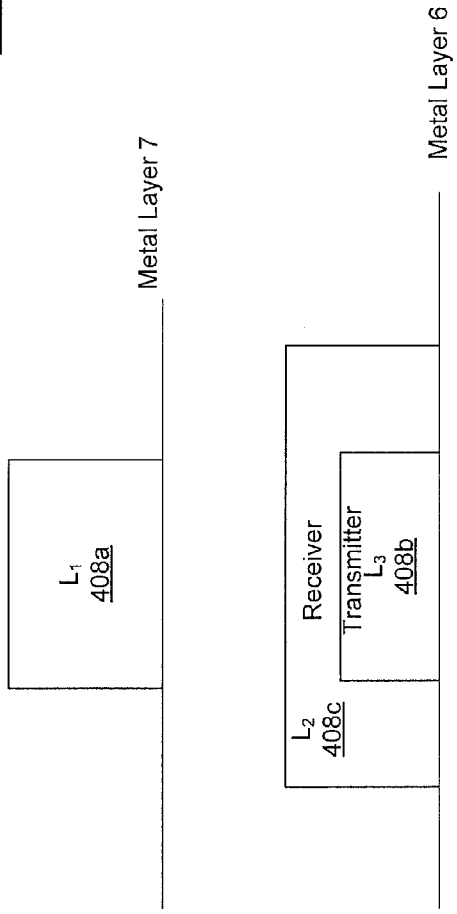
FIG. 5A shows a side view of a balun on a chip according to one embodiment.

FIG. 5A shows a side view of balun 402 on a chip according to one embodiment. In one embodiment, inductor 4-408a may be designed on the metal layer 7. Additionally, inductor 4-408b (e.g., the transmitter) and inductor 4-408c (e.g., the receiver) may be placed on metal layer 6. Metal layer 7 may be aluminum and metal layer 6 may be copper. Although metal layers 6 and 7 are described, it will be understood that other layers may be used. For example, metal layers 4 and 5 may be used or any other combination of metal layers.

Figure 5B:
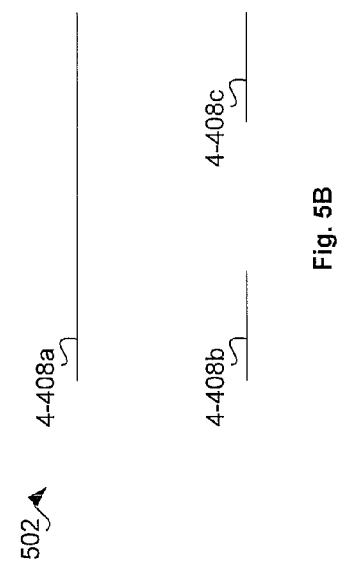
FIG. 5B shows magnetic fields in differently-designed inductors according to one embodiment.

To have a strong coupling, inductors may be designed on top of each other. For example, FIG. 5B shows an example layout 502 according to one embodiment. A first inductor 4-408a is above a second inductor 4-408b and a third inductor 4-408c. A straight line represents a side view of where coils of the inductor are present. Second inductor 4-408b is side-by-side third inductor 4-408c. Thus, antenna 410 is on a different layer or above transmitter 414 and receiver 412. This layout strengthens the coupling between inductors 4-408a and inductor 4-408b, and between inductor 4-408a and inductor 4-408c. Also, the layout provides a weak coupling between inductor 4-408b and inductor 4-408c.

Other layouts may also be used that can achieve strong coupling between inductor 4-408a and inductor 4-408b, and between inductor 4-408a and inductor 4-408c while providing weak coupling between inductor 4-408b and inductor 4-408c. For example, layouts where inductor 4-408c is on top of inductor 4-408a, and where inductor 4-408a is on top of inductor 4-408b may be used. Further, inductor 4-408a, inductor 4-408b, and inductor 4-408c may be side by side on the same layer. Other layouts may also be appreciated and the position of inductors 4-408 on the same layer may be reversed.

Referring back to FIG. 5A, it can be seen that inductor 4-408a is on top of inductor 4-408b and inductor 4-408c. Accordingly, the coupling between inductor 4-408a and inductor 4-408b and between inductor 4-408a and inductor 4-408c is strong. However, the coupling between inductor 4-408b and inductor 4-408c is low because they are side-by-side.

Figure 5C:
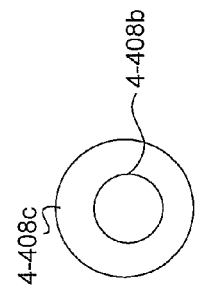
FIG. 5C depicts a side view of the balun on the chip according to one embodiment.

FIG. 5C depicts a top view of balun 4-402 on the chip according to one embodiment. The turns of inductor 4-408a are above the turns of inductor 4-408b and inductor 4-408c. This provides a strong coupling. However, the coupling between the coils of inductor 4-408b and inductor 4-408c is not very strong.

Accordingly, balun 402 provides a weak coupling between transmitter 414 and receiver 412. This allows transmitter 414 and receiver 412 to be designed and optimized separately. Additionally, the impedance ratio and turn ratio may be designed separately because circuit 422 is electrically isolated from circuit 424.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. An apparatus comprising:
   a balun coupled to an antenna, the antenna configured to transmit and receive radio frequency signals, the balun comprising:
   a first inductor including a first set of ports coupled to the antenna;
   a second inductor including a second set of ports coupled to a power amplifier through a first circuit, the power amplifier configured to transmit a first signal to the antenna;
   a third inductor including a third set of ports coupled to a low noise amplifier through a second circuit, the low noise amplifier configured to receive a second signal from the antenna,
   wherein:
   the second set of ports is coupled to the first circuit,
   the third set of ports is coupled to the second circuit,
   the first circuit is separate from the second circuit, and
   a first coupling coefficient of mutual inductance between the first inductor and the second inductor is a first value, a second coupling coefficient of mutual inductance between the first inductor and the third inductor is a second value, and a third coupling coefficient of mutual inductance between the second inductor and the third inductor is a third value, the third value being lower than the first value and the second value.

2. The apparatus of claim 1, wherein a first turn ratio between the first inductor and the second inductor is separately configured from a second turn ratio between the first inductor and the third inductor.

3. The apparatus of claim 2, wherein turns of the third inductor are not in a transmit path used to transmit the first signal, wherein turns of the second inductor are not in a receive path used to receive the second signal.

4. The apparatus of claim 1, wherein a first impedance transformation between the first inductor and the second inductor includes a first impedance ratio and a second impedance transformation between the first inductor and the third inductor includes a second impedance ratio different from the first impedance ratio.

5. The apparatus of claim 1, wherein the first circuit from the power amplifier to the second set of ports has weak electrical coupling with the second circuit from the low noise amplifier to the third set of ports.

6. The apparatus of claim 1, wherein the third inductor is not in a transmit path from the power amplifier to the antenna, wherein the second inductor is not in a receive path from the antenna to the low noise amplifier.

7. The apparatus of claim 1, wherein the first inductor is included on a first layer of a chip, wherein the second inductor and third inductor are included on a second layer of the chip.

8. The apparatus of claim 7, wherein the second layer including the second inductor and the third inductor is on a lower layer than the first layer.

9. The apparatus of claim 7, wherein the first layer comprises a first metal layer of the chip, wherein the second layer comprises a second metal layer of the chip.

10. The apparatus of claim 1, wherein a first magnetic field flows perpendicular to coils of the first inductor, coils of the second inductor, or coils of the third inductor, wherein a second magnetic field flows across the coils of the second inductor or the third inductor.

11. The apparatus of claim 1, wherein the second circuit comprises a first capacitor and a switch.

12. The apparatus of claim 11, wherein the switch is closed when the transceiver is in a half duplex mode and a low noise amplifier is off.

13. The apparatus of claim 12, wherein the first capacitor is configured to compensate for a change in impedance of the low noise amplifier.

14. The apparatus of claim 11, wherein the second circuit comprises a second capacitor configured with a value such that the first inductor and the second inductor resonate at an operating frequency substantially simultaneously with the first inductor and the third inductor at the operating frequency when in a full duplex mode.

15. The apparatus of claim 11, wherein the second circuit comprises a second capacitor configured with a value such that the first inductor and the second inductor resonate at an operating frequency when in a transmit half duplex mode, and the first inductor and the third inductor resonate at the operating frequency when in a receive half duplex mode.

16. A method comprising:
transmitting a first signal to an antenna coupled to a first inductor through a first set of ports, the first signal being transmitted from a first circuit coupled to a second inductor through a second set of ports; and
receiving a second signal from the antenna through the first inductor, the second signal received from the antenna through a third inductor coupled to a second circuit through a third set of ports,
wherein:
the second set of ports is coupled to the first circuit,
the third set of ports is coupled to the second circuit,
the first circuit is separate from the second circuit, and
a first coupling coefficient of mutual inductance between the first inductor and the second inductor is a first value, a second coupling coefficient of mutual inductance between the first inductor and the third inductor is a second value, and a third coupling coefficient of mutual inductance between the second inductor and the third inductor is a third value, the third value being lower than the first value and the second value.

17. The method of claim 16, wherein a first turn ratio between the first inductor and the second inductor is separately configured from a second turn ratio between the first inductor and the third inductor.

18. The method of claim 16, wherein a first impedance transformation between the first inductor and the second inductor includes a first impedance ratio and a second impedance transformation between the first inductor and the third inductor includes a second impedance ratio different from the first impedance ratio.

* * * * *